United States Patent [19]
Jasperson, Jr.
[11] 3,877,808
[45] Apr. 15, 1975

[54] PRINTED CIRCUIT BOARD EXPOSURE HOLDING DEVICE

[76] Inventor: Carl R. Jasperson, Jr., 1164 Pasadena St., Pomona, Calif. 91766

[22] Filed: Aug. 30, 1973

[21] Appl. No.: 393,174

[52] U.S. Cl. .................... 355/128; 355/89; 355/132
[51] Int. Cl. ............................................ G03b 27/04
[58] Field of Search ......... 355/89, 91, 93, 128, 131, 355/132

[56] References Cited

UNITED STATES PATENTS

| | | | |
|---|---|---|---|
| 2,814,975 | 12/1957 | Mears | 355/91 |
| 2,842,037 | 7/1958 | Gobeille et al. | 355/91 |
| 3,634,009 | 1/1972 | Van Dusen et al. | 355/93 |
| 3,734,616 | 5/1973 | Mayhew et al. | 355/89 |

*Primary Examiner*—Fred L. Braun

[57] ABSTRACT

A printed circuit board exposure holding device providing simplified and accurate registration of an image or image mask pattern on both sides of a circuit board blank which is inserted between two hinged panels of the holding device. The continuous hinge connecting an edge of each of the panels retains the image or image mask patterns, which are adhered to the panels, in proper registration with respect to each other. One of the panels has pointed and relieved retaining pins to register the circuit board blank with respect to the image or image mask patterns when the hinged panels are in the closed position, covering both sides of the circuit board blank. Both sides of the circuit board blank can be exposed to ultraviolet light, infrared or other energy source while registered within the holding device.

13 Claims, 5 Drawing Figures

PRINTED CIRCUIT BOARD EXPOSURE HOLDING DEVICE

BACKGROUND

This invention relates to the field of the fabrication of printed circuit boards or chemical milling and more particularly to devices utilized to provide accurate registration between the circuit board blank and the image or image mask pattern which is to be incorporated on the surface of the circuit board blank.

In the fabrication of printed circuit boards a specified layout or circuit pattern is chosen for inclusion on the circuit board. The typical process to transpose this pattern onto the circuit board has been to coat the surface of the circuit board with a photoresist and then place the translucent or opague pattern sheet or image mask over the board. The pattern sheet and the board are then exposed to a light source which will chemically change that portion of the board exposed to the light through the circuit pattern. Subsequently, the pattern sheet is removed and the board is subjected to a certain chemical solution which removes that portion of the board not exposed to the light, or that portion exposed to the light, depending upon the process, leaving a remaining portion which constitutes the desired circuit layout.

Although other procedures are utilized which vary from the briefly described process above, the basic concept is still the same in regard to exposing a specially coated circuit board to an energy source such as light to gain the circuit pattern transfer.

One of the principle concerns or problems in the fabrication of printed circuit boards is maintaining the proper registration or alignment between the layout pattern and the circuit board during the exposure process. One rather simplified approach has been the use of a translucent mounting panel to which the circuit pattern sheet is attached. This mounting panel usually has some type of means to register the circuit board in alignment with the circuit pattern.

The problem of accurate registration between the circuit pattern mask and the circuit board becomes more acute when it is desired to place related circuit patterns on each side of the circuit board. In this case, not only is accurate alignment between the circuit pattern mask and the circuit board important, but also it is essential that the related circuit pattern masks be accurately aligned with respect to each other. A typical approach to this problem has been the use of separate mounting panels where each has one of the circuit patterns attached to it. A two step process is used by aligning one side of the circuit board with one mounting panel and exposing it to light followed by the removal of the circuit board and aligning the other side with the second mounting panel. This procedure consumes a considerable amount of time and effort when considering the fact that several thousands of these printed circuit boards are likely to be produced.

To alleviate the time wasted in transferring the circuit board from one circuit pattern mask to another, some prior art devices have utilized various pin arrangements to provide accurate alignment between the circuit patterns on each side of the circuit board. These pins extend through the layout pattern sheets and the circuit board. Consequently, both sides of the circuit board can be exposed to an energy source through the respectively aligned layout sheets without the necessity of removing the circuit board. However, a disadvantage to these prior art pin arrangements is that for each circuit board the pins must be removed, followed by the insertion of a new circuit board blank, alignment of the opposing layout sheets on each side of the circuit board and the placement of the aligning pins in the aligning apertures in each member. As a result, much time is needed to set up each circuit board blank for the exposure process through the layout sheets.

BRIEF SUMMARY OF THE INVENTION

The present invention is comprised of two rigid translucent plates which are hinged together by a continuous hinge along one edge. Attached to the surface of each of the plates is a circuit layout sheet or mask. The continuous hinge maintains the proper registration between the layout sheets on each of the translucent plates. One side of the circuit board blank is placed on one of the plates in registered orientation by the use of mounting pins. The other plate is pivoted to a closed position over the other side of the circuit board. The circuit board is then ready for exposure through the respective layout sheets on both sides of the board.

One primary advantage of this invention is the ability to quickly and easily insert and remove circuit boards in conjunction with the exposure process.

The use of the continuous hinge maintains the proper alignment between the respective layout sheets for repeated circuit board fabrication.

The simplified basic concept provides an inexpensive device to save a substantial amount of time in the exposure process for the incorporation of layout patterns on both sides of the circuit board.

DETAILED DESCRIPTION OF INVENTION

Figure 1:
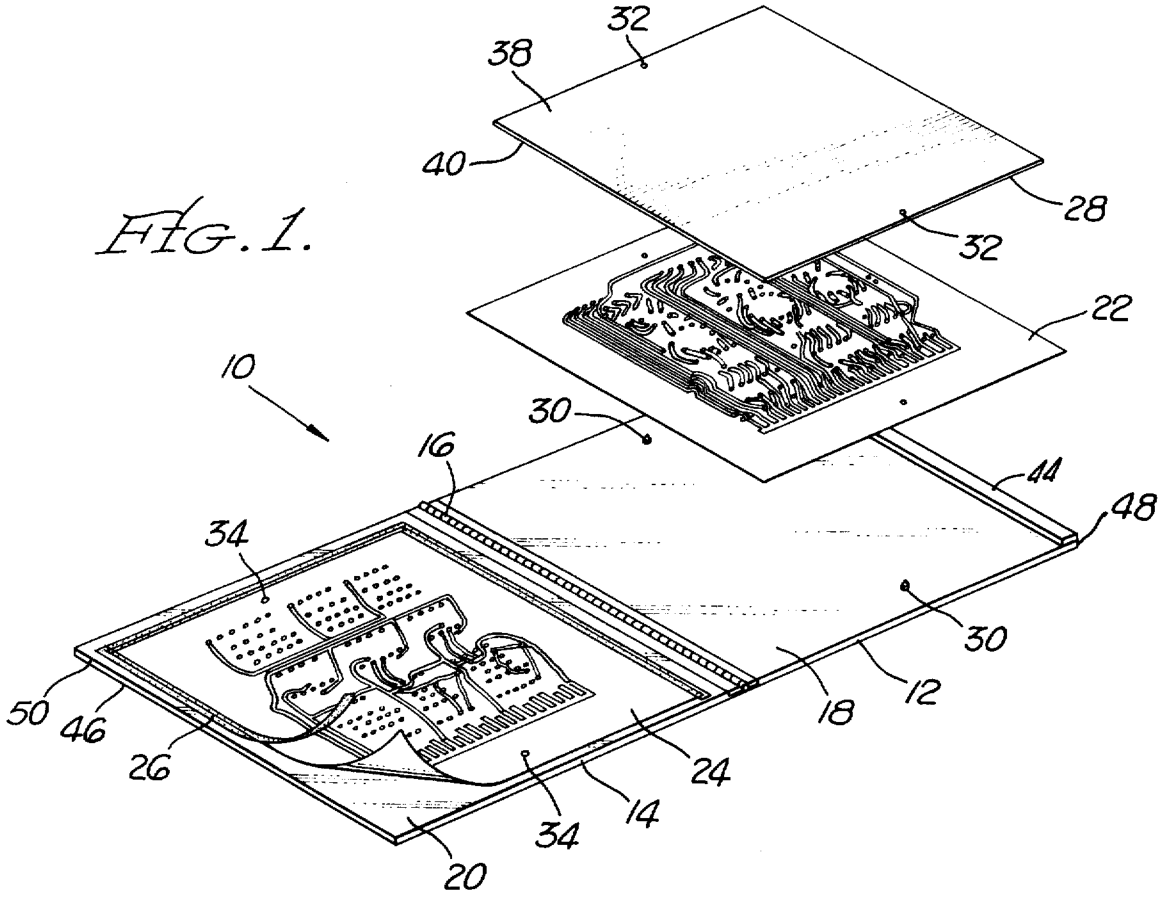
FIG. 1 is a perspective view of the holding device in the open position.

As shown in FIG. 1, the exposure mounting or holding device 10 is comprised of two cover plates or panels 12 and 14, which are pivotally connected by a continuous hinge 16. Attached to the interior surfaces 18 and 20 of the respective cover plates 12 and 14 are translucent layout patterns 22 and 24. These layout patterns or masks 22 and 24 are adhesively secured to the interior surfaces 18 and 20 of the respective cover plates 12 and 14 by the use of appropriate adhesive taping means 26 as shown with respect to the placement of mask 24 on cover plate 14.

The positioning of the respective layout patterns or circuit designs 22 and 24 on the cover plates 12 and 14 is very critical to the operation of holding device when the circuit board blank 28 is placed between the cover plates 12 and 14, as will be explained more fully below.

Figure 2:
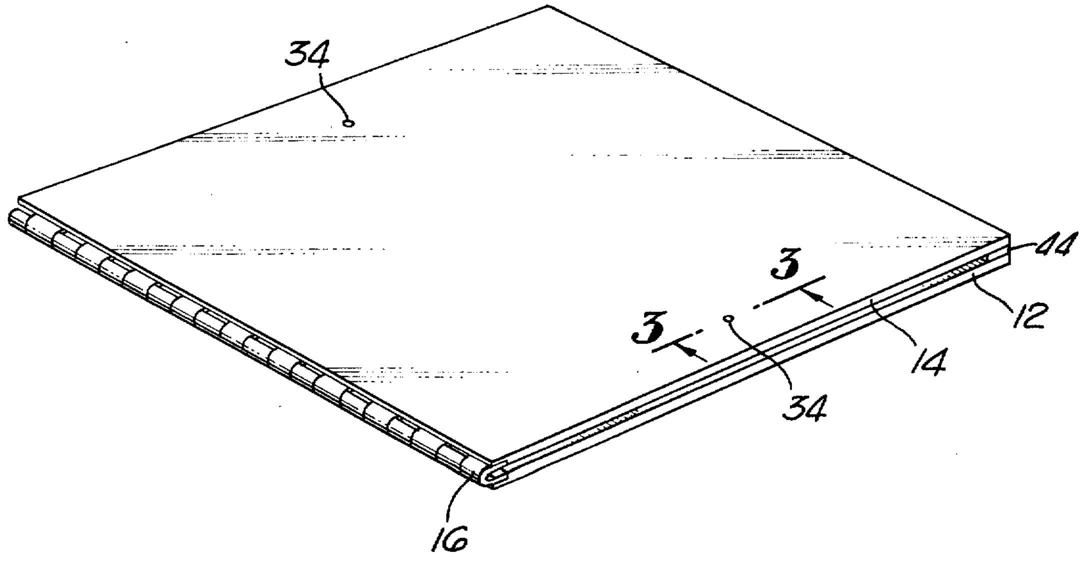
FIG. 2 is a perspective view of the holding device in the closed position.

Connected to cover plate 12 and protruding from its interior surface 18 are a pair of retaining pins 30 which are utilized to properly orient the circuit board 28 when it is placed between the cover plates 12 and 14. The circuit board 28 has a pair of registering apertures 32 which receive the retaining pins 30 in order to provide accurate alignment between the circuit board 28 and the cover plate 12 which has the mask 22 already secured to the interior surface 18 in a precise orientation. The retaining pins 30 are of a sufficient length that they extend completely through the circuit board 28 and slightly above it when the circuit board 28 is positioned over the retaining pins 30. In order to accommodate the additional length of the retaining pins when the cover plate 14 is pivoted to the closed position over the circuit board 28 as shown in FIG. 2, cover plate 14 has a pair of receiving apertures 34.

Figure 3:
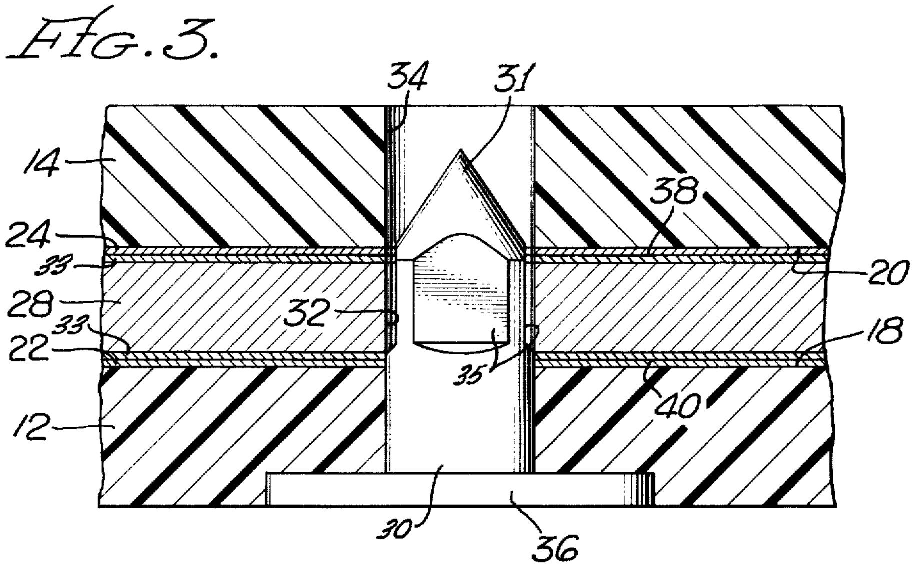
FIG. 3 is a partial sectional view taken along lines 3—3 of FIG. 2.

A more detailed view of the interrelation of the retaining pins 30 with the circuit board 28 and the cover plates 12 and 14 is shown in FIG. 3. The base 36 of pin 30 is anchored within the cover plate 12 and is designed to receive the circuit board 28 and the cover plate 14 when the holding device 10 is in the closed position of FIG. 2 for mounting a circuit board within the interior surfaces 18 and 20 and the respective circuit patterns 22 and 24. It will be noted that the other end of the pin 30 terminates in a point 31 which provides a means for cutting through the film coating 33, which covers the entire surface of the circuit board blank 28, including the apertures 32, when the circuit board blank 28 is registered on the retaining pins 30.

Figures 4, 5:
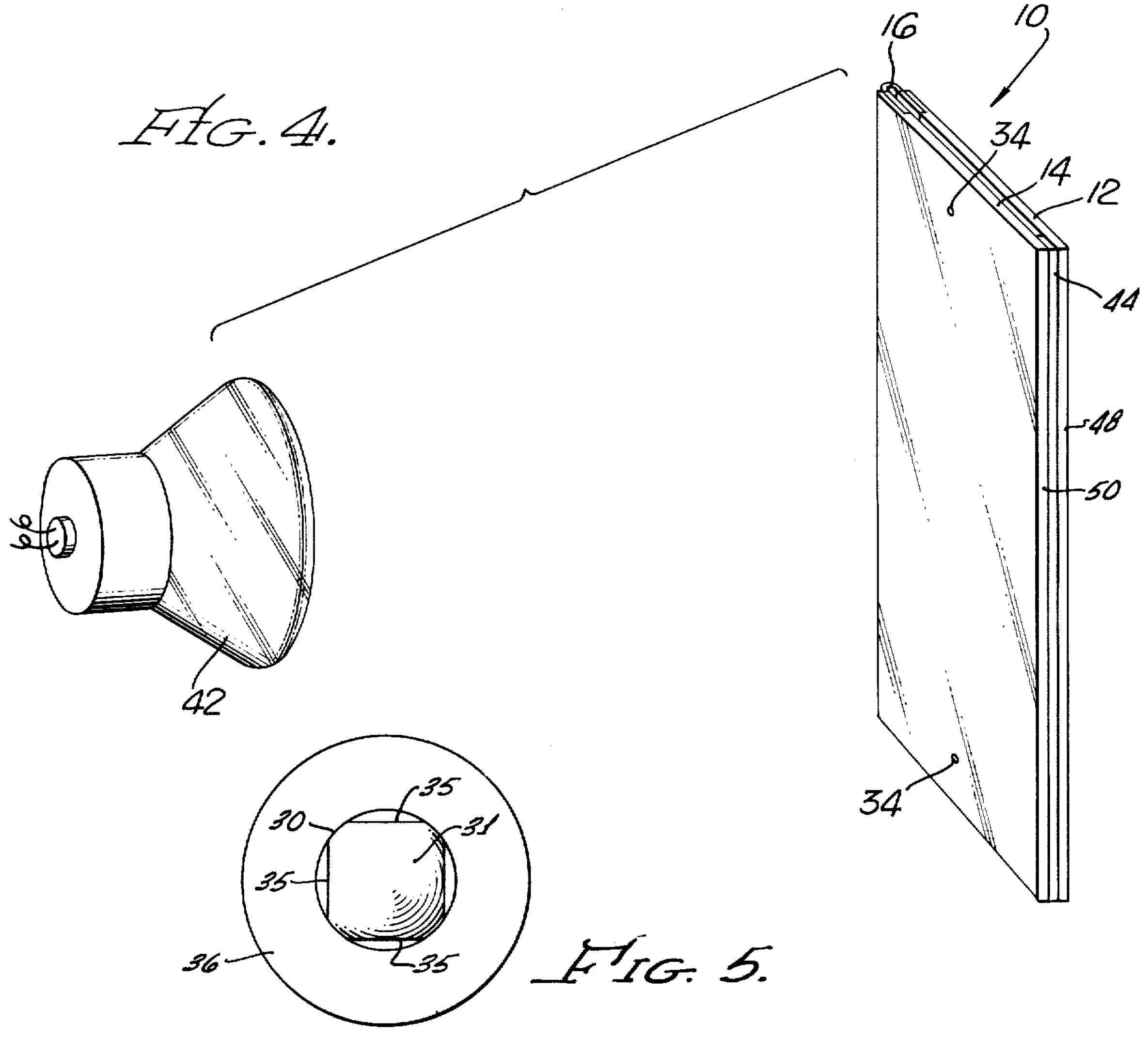
FIG. 4 is a perspective view of the holding device in position for exposure to an energy source.
FIG. 5 is a top view of the retaining pin.

Referring to FIG. 5, the retaining pins 30 have a four sided shape comprised of four relief areas 35 which eliminate some of the friction between the contact of the pin 30 and the aperture 32 of the circuit board 28. This promotes much easier placement and removal of the circuit board blanks 28 within the holding device. Furthermore, the relief areas 35 provide space for that portion of the film coating 33 which is pierced by the retaining pins 30.

In the operation and use of the mounting device 10 the desired masks 22 and 24, having specific circuit pattern designs, are accurately secured to the respective interior surfaces 18 and 20 of the cover plates 12 and 14. With the holding device in the open position of FIG. 1 a blank circuit board 28 with a first and second photosensitive surfaces 38 and 40 is registered on the retaining pins 30 by the registering apertures 32. It is significant to note that these retaining pins 30 are precisely located on the cover plate 12 in relation to the mask 22 in order to insure accurate registration of the circuit board 28 with respect to the layout pattern of mask 22.

Once the circuit board 28 is registered on the retaining pins 30, the cover plate 14 is rotated on the hinge 16 to a position adjacent the circuit board 28, so that the mask 24 is in face-to-face contact with the upper photosensitive surface 38 of the circuit board. The use of the continuous hinge 16 maintains the accurate orientation of the relative positioning of the mask 24 on the upper surface 38 of the circuit boaard 28 with respect to the position of the mask on the lower surface 40 of the circuit board. This is very critical in that the circuit patterns represented on masks 22 and 24 are interrelated with respect to the overall circuit layout which will be transformed onto both sides of the circuit board blank 28.

The patterns in the layout masks 22 and 24 to be transposed onto the circuit board 28 are translucent as are the rigid cover plates 12 and 14 in order to allow an energy source such as light to reach the desired portions of the energy sensitive or photosensitive surfaces of the circuit board 28.

When the circuit board 28 has been registered on the retaining pins 30 and the cover plates 12 and 14 are in the closed position as shown in FIG. 4, the translucent cover plate 14 and its corresponding mask 24 are exposed to an energy source 42 which will cause a chemical change in that portion of the coating on the first surface 38 of the circuit board. The holding device is either rotated 180° or the energy source moved adjacent the other cover plate 12 and the exposure process is repeated to produce surface 40 to which the layout pattern 22 allows light to reach. The exposed circuit board 28 is subsequently removed from the holding device 10 and subjected to a chemical etching process to establish the conductive circuit pattern which represents the design in the layout masks 22 and 24. To aid in the opening of the closed holding device 10, a spacer member 44 is placed along the interior surface 18 of the plate 12 adjacent its outside edge 48. This spacer member 44 has approximately the same thickness as the circuit board blank 28 to allow a space between the cover plates 12 and 14 for easier opening and is designed to be more compatible with various circuit board configurations. When the holding device is in the closed position as in FIG. 4 the spacer member 44 is adjacent the outside edges 48 and 50 of the respective cover plates 12 and 14. This spacer member 44 also prevents the holding device from bending during exposure caused by the existence otherwise of a gap between the outer edges 48 and 50 of the respective cover plates 12 and 14.

Depending upon how many printed circuit boards are to be made utilizing the same patterns reflected in masks 22 and 24, additional circuit board blanks 28 are placed in the holding device 10 and the procedure discussed above is repeated. Because of their simple and inexpensive construction, several holding devices can be used for each different printed circuit board to be produced by using different circuit pattern layouts or masks. The only differences in the holding devices 10 is the replacement and attachment of different layout patterns or masks.

What is claimed is:

1. An exposure mounting device for exposing both faces of a circuit board, said device comprising:

a pair of panels;

a first layout mask accurately located at a first position on one of said pair of panels;

a second layout mask accurately located at a second position on the other of said pair of panels;

said first position of said first layout mask and said second position of said second layout mask being accurately aligned with respect to each other when said pair of panels are in face-to-face relation;

means for securing said first layout mask to said one of said pair of panels and said second layout mask to said other of said pair of panels, said securing means preventing relative movement between said first layout mask and said one of said pair of panels and between said second layout mask and said other of said pair of panels;

means for pivotally connecting said pair of panels together, allowing said panels to accurately pivot between an opened and a closed orientation with respect to each other, said connecting means providing accurate alignment of said pair of panels in said closed orientation, said connecting means maintaining said accurate alignment of said first and second layout masks with respect to each other as said pair of panels are moved between said opened and closed orientations; and means located on one of said panels for registering said printed circuit board within said panels.

2. An exposure mounting device as defined in claim 1 wherein said means for pivotally connecting said pair of panels together comprises a hinging means connected to an edge of each of said panels.

3. An exposure mounting device as defined in claim 2 wherein said hinging means comprises a continuous hinge extending along an edge of each of said panels.

4. An exposure mounting device as defined in claim 1 wherein said means for registering said printed circuit board comprises retaining pins extending from the inside surface of one of said panels, and registering apertures within said printed circuit board to receive said pins to maintain said printed circuit board in accurate alignment with said layout masks.

5. An exposure mounting device as defined in claim 4 wherein said retaining pins have one end pointed to pierce a coating on said circuit board.

6. An exposure mounting device as defined in claim 4 wherein said retaining pins have relief areas along their longitudinal surfaces to eliminate some of the frictional contact between said retaining pins and said registering apertures.

7. An exposure mounting device as defined in claim 1 wherein said pair of panels are translucent.

8. An exposure mounting device as defined in claim 1 and additionally comprising means for promoting ready movement of said panels from the closed to the open orientation.

9. An exposure mounting device as defined in claim 8, wherein said means for promoting ready movement of said panels comprises a spacer member along an edge of one of said panels.

10. A circuit board exposure holder for exposing both faces of a circuit board, said holder comprising:

a pair of opposing cover plates, each of said plates having an interior surface;

means for pivotally connecting said cover plates in precise juxtaposed relation to each other to provide alignment of said cover plates when said interior surfaces of said cover plates are moved into face to face orientation;

a pair of image masks, each attached respectively in face-to-face contact with a surface of each of said cover plates; and means for securing each of said pair of image masks respectively to said pair of cover plates, said securing means preventing relative movement between each of said pair of image masks and each of said cover plates, said masks maintained in accurate alignment with one another by said connecting means when said cover plates are in said closed position.

11. A device for registering printed circuit boards between two opposing image masks, said device comprising:

a pair of translucent panels having inside and outside faces;

a first layout mask attached to said inside face of one of said pair of panels;

a second layout mask attached to said inside face of the other of said pair of panels;

means for pivotally attaching said panels together, allowing said inside faces of said panels to be moved in a precisely aligned juxtaposed relation, said attaching means maintaining accurate alignment of said first and second layout masks with respect to each other as said inside faces of said pair of panels are moved into a face-to-face position; and means located on one of said inside faces for mounting said circuit board in alignment with said image masks when said inside faces of said panels are in said juxtaposed relation.

12. A printed circuit board retaining device for exposing both faces of a circuit board, said device comprising:

a pair of holding members made of translucent material;

means for pivotally connecting said holding members to each other, said holding members capable of retaining said printed circuit board when said holding members are pivoted to a face-to-face position;

an image mask securely attached to each of said holding members, said connecting means maintaining proper alignment between said image masks on each of said holding members when said holding members are pivoted to a face-to-face position; and means located on one of said holding members for anchoring said circuit board in proper alignment with said image masks when said holding members are in said face-to-face position.

13. A method of producing a circuit design on two sides of a circuit board blank comprising the steps of:

securely attaching a first translucent layout pattern on a surface of one of two pivotally connected translucent plates;

securely attaching a second translucent layout pattern on a surface of the other of said two pivotally connected translucent plates, said first and second layout patterns being held in accurate alignment with each other by said pivotally connected translucent plates;

placing said circuit board blank on registering pins connected to one of said plates, said circuit board blank having photosensitive surfaces;

pivoting said plates to a closed position resulting in said plates mating with opposite sides of said circuit board blank, and said layout patterns on said plates being in accurate registration with each other;

exposing each of said plates with said layout pattern to an energy source;

removing said circuit board blank from said registering pins; and etching said circuit board blank by subjecting the same to an appropriate chemical process.

* * * * *